United States Patent
Toguchi et al.

(10) Patent No.: US 6,759,144 B2
(45) Date of Patent: *Jul. 6, 2004

(54) ORGANIC ELECTROLUMINESCENCE DEVICE

(75) Inventors: Satoru Toguchi, Tokyo (JP); Hitoshi Ishikawa, Tokyo (JP); Yukiko Morioka, Tokyo (JP); Atsushi Oda, Tokyo (JP)

(73) Assignee: Samsung SDI Co., Ltd., Suwon (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/459,877

(22) Filed: Dec. 14, 1999

(65) Prior Publication Data
US 2003/0134145 A1 Jul. 17, 2003

(30) Foreign Application Priority Data

Dec. 16, 1998 (JP) .......................................... 10-357822
Jan. 13, 1999 (JP) .......................................... 11-007051

(51) Int. Cl.$^7$ .............................................. H05B 33/12
(52) U.S. Cl. ........................ 428/690; 428/917; 313/504; 313/506
(58) Field of Search .............................. 428/690, 704, 428/917; 313/504, 506

(56) References Cited

U.S. PATENT DOCUMENTS 5,443,922 A * 8/1995 Nishizaki et al. ........... 428/690

FOREIGN PATENT DOCUMENTS

| EP | 0 866 110 A1 | * | 9/1998 |
| JP | 3-200289 | | 9/1991 |
| JP | 7-138561 | | 5/1995 |
| JP | 8-20771 | | 1/1996 |
| JP | 8-40995 | | 2/1996 |
| JP | 8-40997 | | 2/1996 |
| JP | 8-53397 | | 2/1996 |
| JP | 8-87122 | | 4/1996 |
| JP | 8-239655 | | 9/1996 |
| JP | 9-268284 | | 10/1997 |
| JP | 9-289081 | | 11/1997 |
| JP | 10-226172 A | | 8/1998 |
| JP | 10-251633 | | 9/1998 |
| JP | 11-185961 | * | 7/1999 |
| JP | 2000-58261 | | 2/2000 |
| JP | 2000-113984 | | 4/2000 |
| JP | 2000-208265 A | | 7/2000 |
| KR | 2000-0035289 A | | 6/2000 |

OTHER PUBLICATIONS

Japanese Office Action dated May 9, 2001 with translation.

* cited by examiner

*Primary Examiner*—Marie Yamnitzky
(74) *Attorney, Agent, or Firm*—McGuireWoods LLP

(57) ABSTRACT

An organic electroluminescent device comprising an anode, a cathode and one or more than one organic thin-film layers including a light-emitting layer between said anode and said cathode, wherein at least one of said organic thin-film layers contains, either singly or as a mixture, a perylene compound represented by the following formula (1):

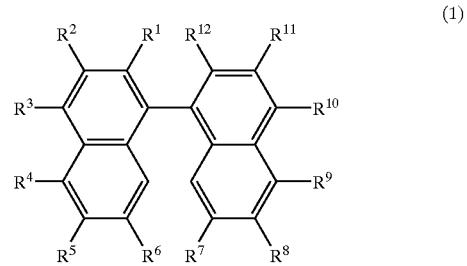

(1)

wherein at least one of $R^1$ to $R^{12}$ is a substituted amino group.

4 Claims, 2 Drawing Sheets

ORGANIC ELECTROLUMINESCENCE DEVICE

BACKGROUND OF THE INVENTION

1. Field of the Invention

This invention relates to an electroluminescent device having excellent luminescence properties.

2. Description of the Related Art

An organic electroluminescent device (which will hereinafter be called "organic EL device") is a light-emitting device which makes use of the principle that when an electric field is applied, a fluorescent material emits light in response to the charge recombination of holes injected from an anode and electrons injected from a cathode.

After C. W. Tang et al. of Eastman Kodak Company reported a low-voltage-driven organic EL device using a double layered structure (C. W. Tang, S. A. Vanslyke, Applied Physics Letters, 51,913(1987) and the like), studies on an organic EL device have been briskly carried out. Tang et al. reported an organic EL device using tris(8-hydroxyquinolinol aluminum) in a light-emitting layer and a triphenyldiamine derivative to a hole-transporting layer. This stacked structure gives such advantages as an improvement in the injection efficiency of holes into the light-emitting layer; blocking of electrons injected from a cathode, which increase the efficiency of exciton production from charge recombination; and confinement of the excitons into the light-emitting layer. A double layered structure composed of a hole-injecting and transporting layer and an electron-transporting and light-emitting layer or a triple layered structure composed of a hole-injecting and transporting layer, a light-emitting layer and an electron-injecting and transporting layer is well known as an organic EL device. In order to increase the recombination efficiency of injected holes and electrons, various improvements in the device structure or fabrication process have been introduced to such multi-layered devices.

As a hole-transporting material, triphenylamine derivatives such as 4,4',4"-tris(3-methylphenylphenylamino) triphenylamine and aromatic diamine derivatives such as N,N'-diphenyl-N,N'-bis(3-methylphenyl)-[1,1'-biphenyl]-4,4'-diamine, which are starburst molecules, are well known (e.g., Japanese Patent Application Laid-Open Nos. 20771/1996, 40995/1996, 40997/1996, 53397/1996 and 87122/1996). As an electron-transporting material, oxadiazole derivatives, triazole derivatives and the like are well known.

As a light-emitting material, known are chelate complexes such as tris(8-quinolinolate)aluminum complex, coumarin derivatives, tetraphenylbutadiene derivatives, bis-styrylarylene derivatives, oxadiazole derivatives and the like. Since various color light in a visible region from blue to red are obtained from these light-emitting materials, there increased expectation for industrialization of a full color organic EL device (e.g., Japanese Patent Application Laid-Open Nos. 239655/1996, 138561/1995, 200289/1991 and the like). The pyrromethene-$BF_2$ complexes are well known as a luminescent material (e.g., Japanese Patent Application Laid-Open Nos. 289081/1997).

In recent days, organic EL devices with high brightness and long lifetime have been disclosed or reported, but any of them are not enough in these properties.

SUMMARY OF THE INVENTION

An object of the present invention is to provide a material of high performance and to provide an organic EL device having high luminance.

The present inventors have repeated experiments. As a result, they have found that an organic EL device having superior emission properties is obtained by using particular perylene derivatives or pyrromethene-metal complexs as a luminescent material.

The present inventors have found that said materials has high carrier transporting properties and an organic EL device having superior emission properties is obtained by using said compounds as a hole-transporting material or electron-transporting material. The present inventors have found that an organic EL device having superior emission properties is obtained by using a mixture of said compounds and another hole or electron-transporting material.

In the present invention, there is thus provided an organic electroluminescent device comprising an anode, a cathode and one or more than one organic thin-film layers including a light-emitting layer between said anode and said cathode, wherein at least one of said organic thin-film layers contains, either singly or as a mixture, a perylene compound represented by the following formula (1):

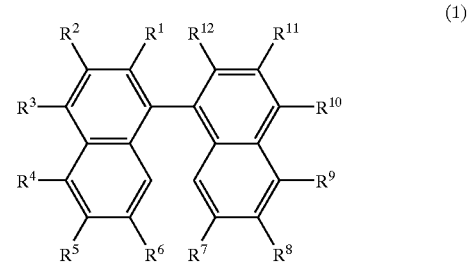

(1)

wherein $R^1$ to $R^{12}$ each independently represents a hydrogen atom, a halogen atom, a hydroxy group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group or a substituted or unsubstituted aryloxy group; and any two of $R^1$ to $R^{12}$ may form a ring; although at least one of $R^1$ to $R^{12}$ is a substituted amino group represented by the following formula (2):

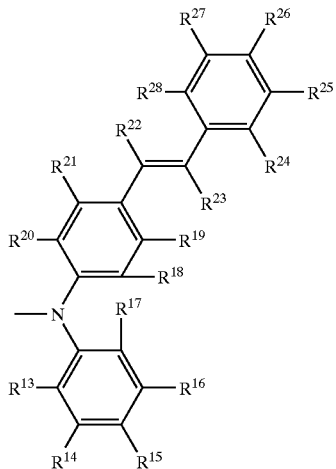

(2)

wherein $R^{13}$ to $R^{23}$ each independently represents a hydrogen atom, a halogen atom, a hydroxy group, a substituted or unsubstituted amino group (except diarylamino group), a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, a substituted or unsubstituted styryl group, or a carboxyl group; and any two of $R^{13}$ to $R^{23}$ may form a ring; and $R^{24}$ to $R^{28}$ each independently represents a hydrogen atom, a halogen atom, a hydroxy group, a substituted or unsubstituted diarylamino group expressed by $—NAr_1^{1}Ar_1^{2}$ wherein $Ar_1^{1}$ and $Ar_1^{2}$ each independently represents substituted or unsubstituted aryl group having 6–20 carbon atoms, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group or a carboxyl group; and any two of $R^{24}$ to $R^{28}$ may form a ring.

In the present invention, there is also thus provided an organic electroluminescent device comprising an anode, a cathode and one or more than one organic thin-film layers including a light-emitting layer between said anode and said cathode, wherein at least one of said organic thin-film layers contains, either singly or as a mixture, a pyrromethene-metal complex represented by the following formula (3):

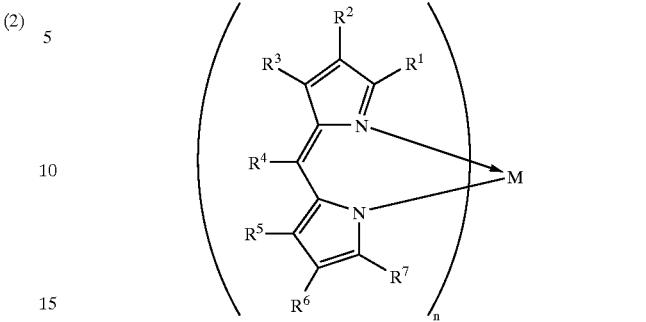

(3)

wherein M represents monovalent, divalent or trivalent metal ion; n is an integer of 1, 2 or 3; $R^1$ to $R^7$ each independently represents a hydrogen atom, a halogen atom, a hydroxy group, a substituted or unsubstituted amino group, a nitro group, a cyano group, a substituted or unsubstituted alkyl group, a substituted or unsubstituted alkenyl group, a substituted or unsubstituted styryl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group or a carboxyl group; and any two of $R^1$ to $R^7$ may form a ring.

The organic EL device according to the present invention which contains a compound of formula (1) or (3) in an organic thin-film layer emits light with higher brightness compared with the conventional organic EL device.

DETAILED DESCRIPTION OF THE INVENTION

Figure 1:
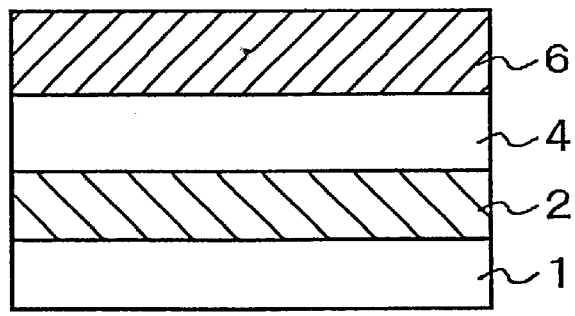
FIGS. 1 to 4 are schematic cross-sectional views of an organic EL device according to the present invention, wherein 1 is a substrate, 2 is an anode, 3 is a hole-transporting layer, 4 is a light-emitting layer, 5 is an electron-transporting layer and 6 is a cathode.

The present invention will hereinafter be described specifically.

The specific perylene compound to be used for the organic EL device of the present invention is a compound having a structure represented by formula (1). In formula (1), $R^1$ to $R^{12}$ each independently represents a hydrogen atom, a halogen atom, a hydroxy group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group or a substituted or unsubstituted aryloxy group; and any two of $R^1$ to $R^{12}$ may form a ring; although at least one of $R^1$ to $R^{12}$ is a substituted amino group represented by the formula (2).

Examples of the halogen atom include fluorine, chlorine, bromine or iodine. The substituted or unsubstituted amino group is expressed by $-NX^1X^2$, wherein each of $X^1$ and $X^2$ independently represents hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2- hydroxyethyl group, 2-hydroxyisobutyl group, 1,2-dihydroxyethyl group, 1,3-ihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinirtroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9- naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-5-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2- phenothiazinyl group, 3-phenothiazinyl group, 4- phenothiazinyl group, 1-phenoxazinyl group, 2- phenoxazinyl group, 3-phenoxazinyl group, 4- phenoxazinyl group, 2-oxazolyl group, 4-oxazolyl group, 5-oxazolyl group, 2-oxadiazolyl group, 5-oxadiazolyl group, 3-furazanyl group, 2 thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Examples of the substituted or unsubstituted alkyl group include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2- hydroxyethyl group, 2-hydroxyisobutyl group, 1,2-dihydroxyethyl group, 1,3-ihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinirtroisopropyl group, 2,3-dinitro-t-butyl group and 1,2,3-trinitropropyl group.

Examples of the substituted or unsubstituted alkenyl group include vinyl group, allyl group, 1-butenyl group, 2-butenyl group, 3-butenyl group, 1,3-butadienyl group, 1-methylvinyl group, 1-methylallyl group, 1,1-dimethylallyl group, 2-methylallyl group, 1-phenylallyl group, 3-phenylallyl group, 3,3-diphenylallyl group, 1,2-dimethylallyl group, 1-phenyl-1-butenyl group and 3-phenyl-1-butenyl group.

Examples of the substituted or unsubstituted cycloalkyl group include cyclopropyl group, cyclobutyl group, cyclopentyl group, cyclohexyl group and 4-methylcyclohexyl group.

The substituted or unsubstituted alkoxy group is expressed by —OY, wherein Y represents methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-ihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinirtroisopropyl group, 2,3-dinitro-t-butyl group or 1,2,3-trinitropropyl group.

Examples of the substituted or unsubstituted aromatic hydrocarbon group include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group and 4"-t-butyl-p-terphenyl-4-yl group.

Examples of the substituted or unsubstituted aromatic heterocyclic group include 1-pyrrolyl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2 thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group,3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Examples of the substituted or unsubstituted aralkyl group include benzyl group, 1-phenylethyl group, 2-phenylethyl group, 1-phenylisopropyl group,2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylmethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

The substituted or unsubstituted aryloxy group is expressed by —OZ, wherein Z represents phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9- naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-ylgroup, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinylgroup, 2-indolyl group, 3-indolyl group, 4-indolyl group, 5-indolyl group,6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group,2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2- phenothiazinyl group, 3-phenothiazinyl group, 4- phenothiazinyl group, 1-phenoxazinyl group, 2- phenoxazinyl group, 3-phenoxazinyl group, 4- phenoxazinyl group, 2-oxazolyl group, 4-oxazolyl group, 5-oxazolyl group, 2-oxadiazolyl group, 5-oxadiazolyl group, 3-furazanyl group, 2 thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group or 4-t-butyl-3-indolyl group.

$R^{13}$ to $R^{23}$ each independently represents a hydrogen atom, a halogen atom, a hydroxy group, a substituted or unsubstituted amino group (except diarylamino group), a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, a substituted or unsubstituted styryl group, or a carboxyl group; and any two of $R^{13}$ to $R^{23}$ may form a ring.

$R^{24}$ to $R^{28}$ each independently represents a hydrogen atom, a halogen atom, a hydroxy group, a substituted or unsubstituted diarylamino group expressed by —$NAr_1^1Ar_1^2$ wherein $Ar_1^1$ and $Ar_1^2$ each independently represents substituted or unsubstituted aryl group having 6–20 carbon atoms, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group or a carboxyl group; and any two of $R^{24}$ to $R^{28}$ may form a ring.

In formula (2), $R^{13}$ to $R^{23}$ each independently represents a hydrogen atom, the halogen atom as mentioned before, a hydroxy group, the substituted or unsubstituted amino group as mentioned before (except diarylamino group), a nitro group, a cyano group, the substituted or unsubstituted alkyl group as mentioned before, the substituted or unsubstituted alkenyl group as mentioned before, the substituted or unsubstituted cycloalkyl group as mentioned before, the substituted or unsubstituted alkoxy group as mentioned before, the substituted or unsubstituted aromatic hydrocarbon group as mentioned before, the substituted or unsubstituted aromatic heterocyclic group as mentioned before, the substituted or unsubstituted aralkyl group as mentioned before, the substituted or unsubstituted aryloxy group as mentioned before, a substituted or unsubstituted alkoxycarbonyl group, a substituted or unsubstituted styryl group, or a carboxyl group; and any two of $R^{13}$ to $R^{23}$ may form a ring.

The substituted or unsubstituted alkoxycarbonyl group is expressed by —COOY, wherein Y represents methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group or 1,2,3-trinitropropyl group.

Examples of the substituted or unsubstituted styryl group include unsubstituted styryl group and 2,2-diphenylvinyl group as well as substituted styryl group and substituted 2,2-diphenylvinyl group whose terminal phenyl group has one or more substituents such as a halogen atom, a hydroxy group, a substituted or unsubstituted diarylamino group expressed by —$NAr^1Ar^2$ where $Ar^1$ and $Ar^2$ each independently represents a substituted or unsubstituted aryl group having 6–20 carbon atoms, a nitro group, a cyano group, the substituted or unsubstituted alkyl group as mentioned before, the substituted or unsubstituted alkenyl group as mentioned before, the substituted or unsubstituted cycloalkyl group as mentioned before, the substituted or unsubstituted alkoxy group as mentioned before, the substituted or unsubstituted aromatic hydrocarbon group as mentioned before, the substituted or unsubstituted aromatic heterocyclic group as mentioned before, the substituted or unsubstituted aralkyl group as mentioned before, the substituted or unsubstituted aryloxy group as mentioned before, a substituted or unsubstituted alkoxycarbonyl group or a carboxyl group.

Examples of the aryl group having 6–20 carbon atoms include phenyl group, naphthyl group, anthryl group, phenanthryl group, naphthacenyl group and pyrenyl group.

These aryl groups may have a halogen atom, a hydroxy group, a nitro group, a cyano group, the substituted or unsubstituted alkyl group as mentioned before, the substituted or unsubstituted alkenyl group as mentioned before, the substituted or unsubstituted cycloalkyl group as mentioned before, the substituted or unsubstituted alkoxy group as mentioned before, the substituted or unsubstituted aromatic hydrocarbon group as mentioned before, the substituted or unsubstituted aromatic heterocyclic group as mentioned before, the substituted or unsubstituted aralkyl group as mentioned before, the substituted or unsubstituted aryloxy group as mentioned before, a substituted or unsubstituted alkoxycarbonyl group or a carboxyl group.

$R^{24}$ to $R^{28}$ each independently represents a hydrogen atom, a halogen atom, a hydroxy group, the substituted or unsubstituted diarylamino group expressed by —$NAr^1Ar^2$ where $Ar^1$ and $Ar^2$ each independently represents a substituted or unsubstituted aryl group having 6–20 carbon atoms as mentioned before, a nitro group, a cyano group, the substituted or unsubstituted alkyl group as mentioned before, the substituted or unsubstituted alkenyl group as mentioned before, the substituted or unsubstituted cycloalkyl group as mentioned before, the substituted or unsubstituted alkoxy group as mentioned before, the substituted or unsubstituted aromatic hydrocarbon group as mentioned before, the substituted or unsubstituted aromatic heterocyclic group as mentioned before, the substituted or unsubstituted aralkyl group as mentioned before, the substituted or unsubstituted aryloxy group as mentioned before, a substituted or unsubstituted alkoxycarbonyl group or a carboxyl group; and any two of $R^{24}$ to $R^{28}$ may form a ring.

In $R^1$ to $R^{28}$, examples of a bivalent group forming a ring include tetramethylene group, pentamethylene group, hexamethylene group, diphenylmethan-2,2'-diyl group, diphenylethan-3,3'-diyl group, diphenylpropan-4,4'-diyl group and 1,3-butadien-1,4-diyl group.

Examples of the compounds represented by formula (1) to be used in the organic EL device of the present invention are shown below, but it should be borne in mind that the present invention is not limited by them.

(1)-1
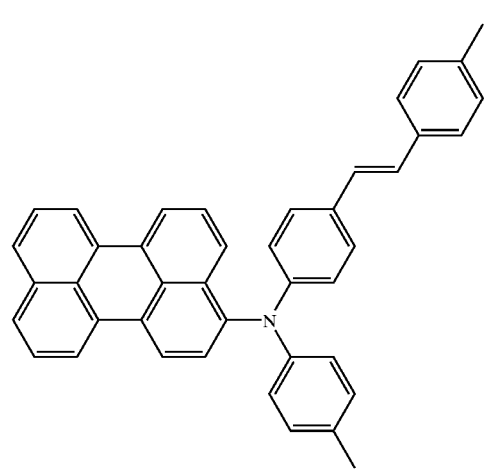
(1)-2
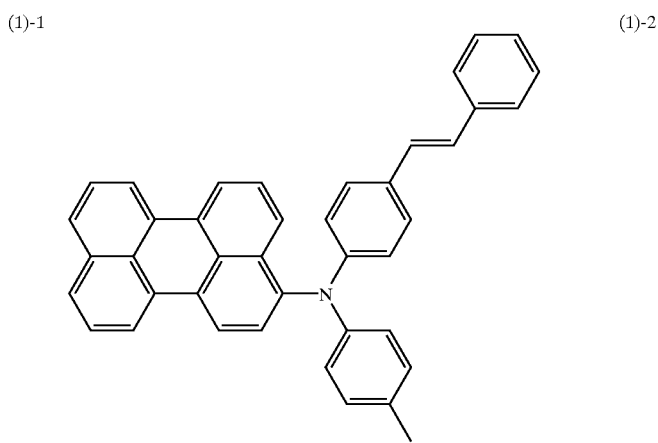
(1)-3
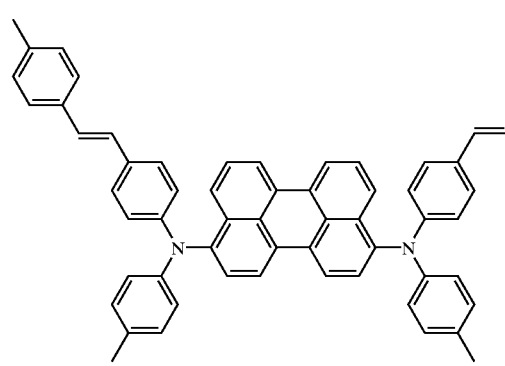
(1)-4
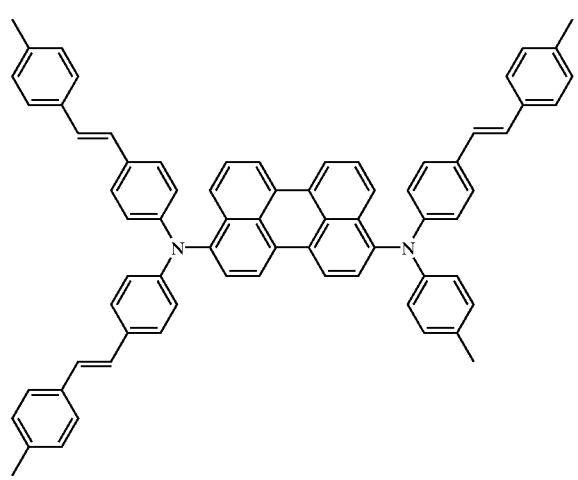
(1)-5
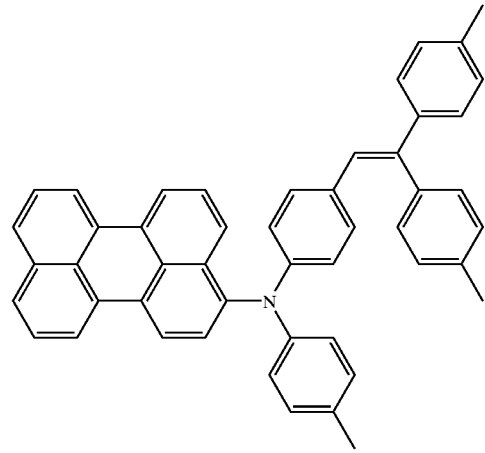
(1)-6
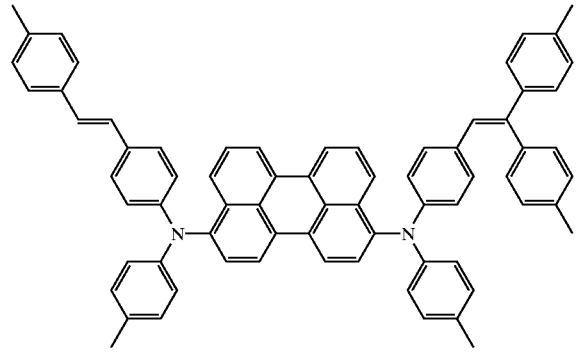

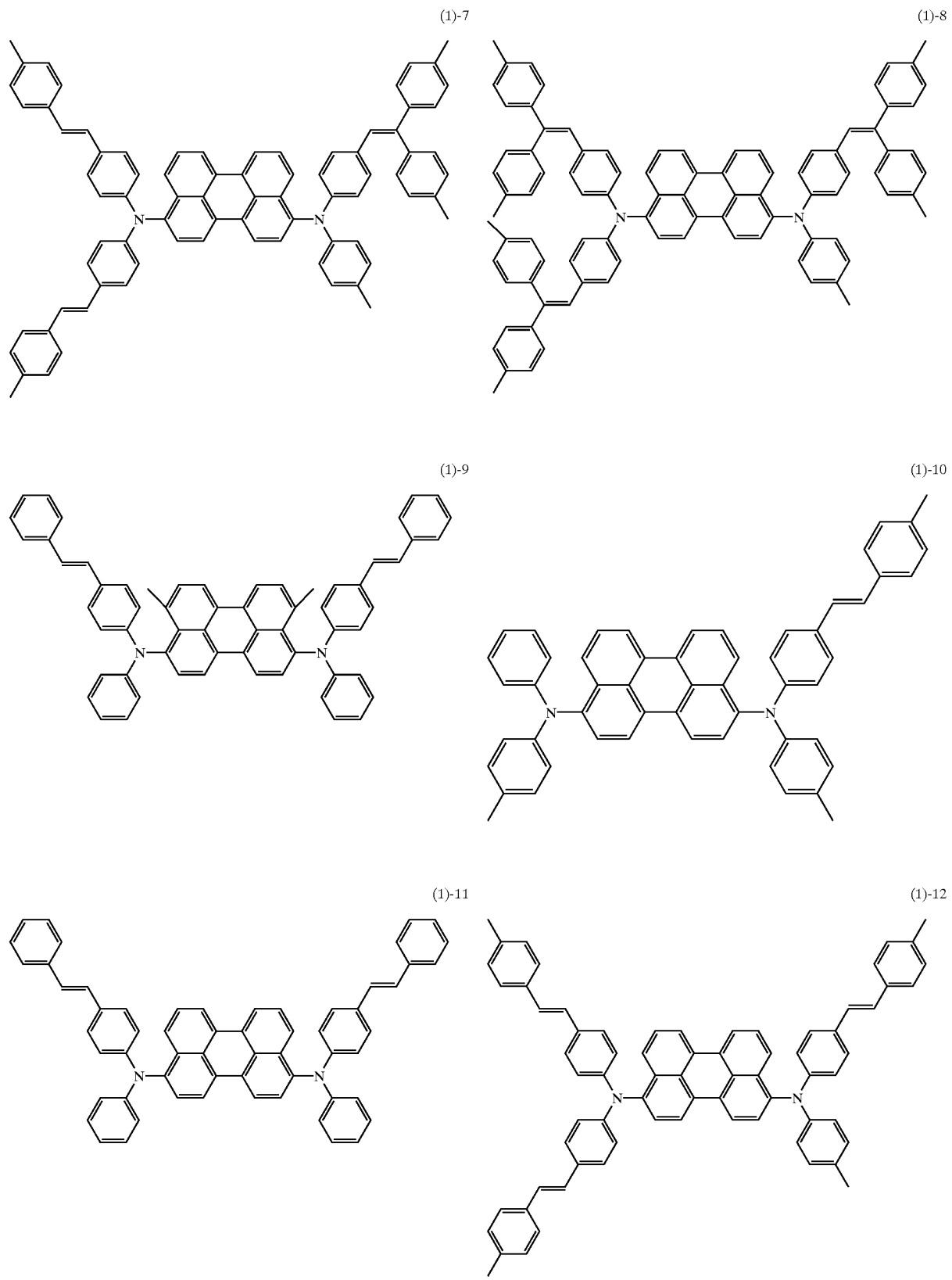

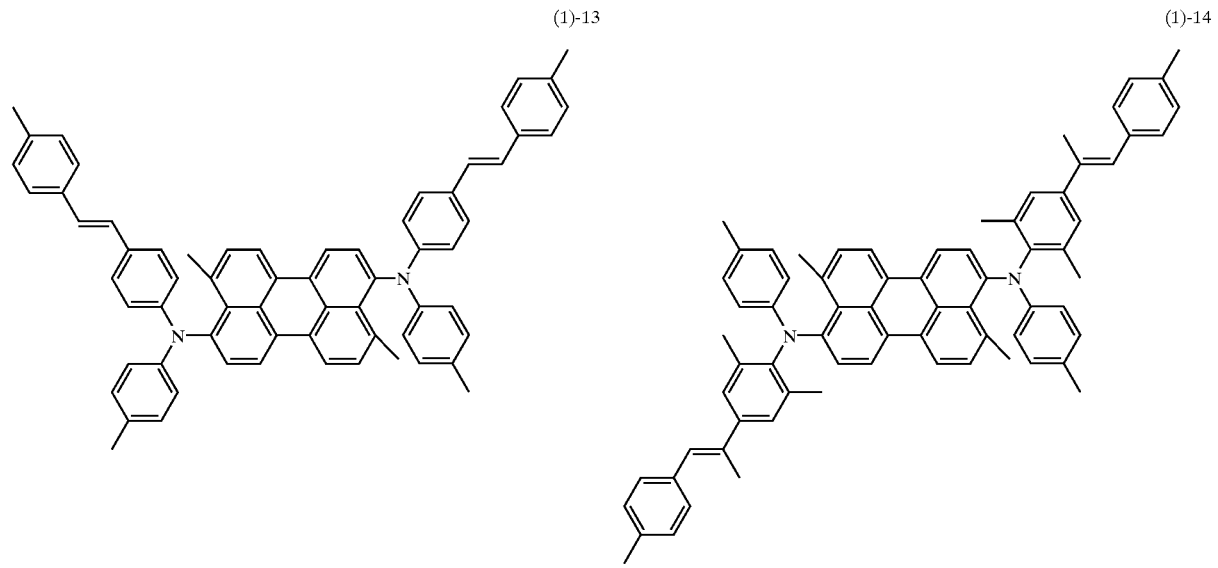
(1)-13
(1)-14
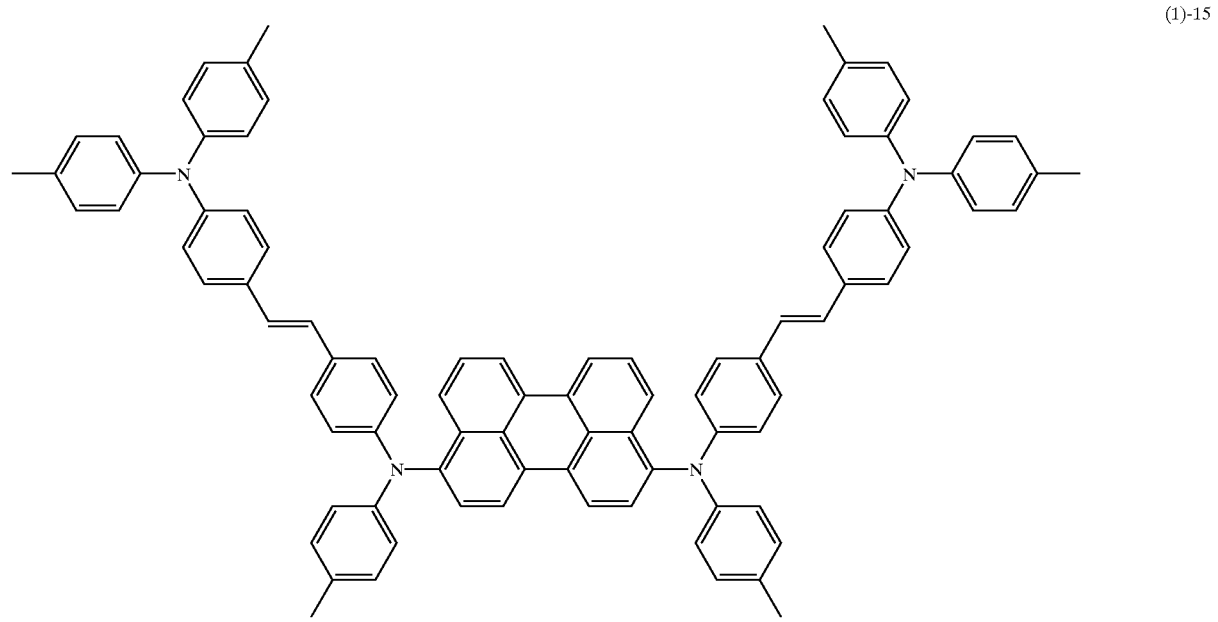
(1)-15

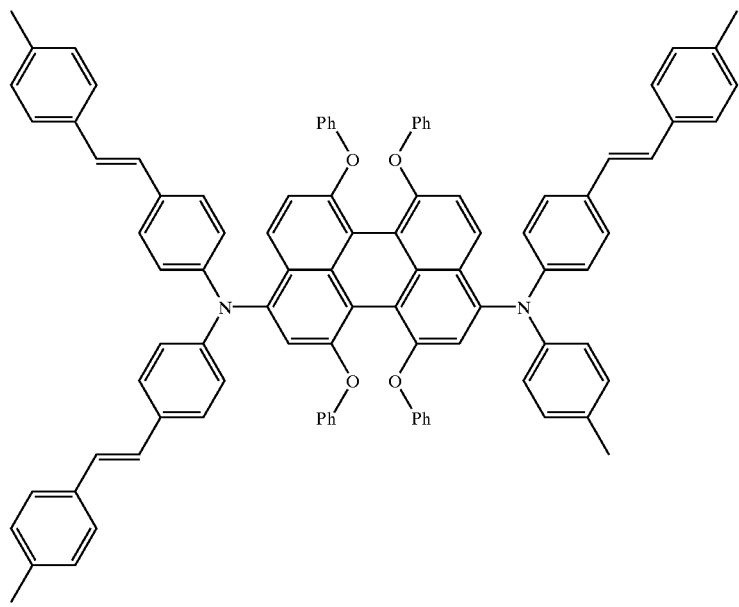

(1)-16

Figure 2:
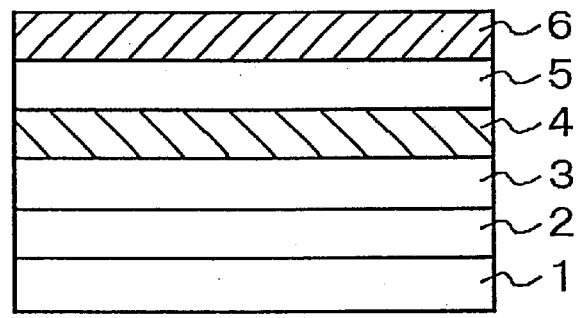
Figure 3:
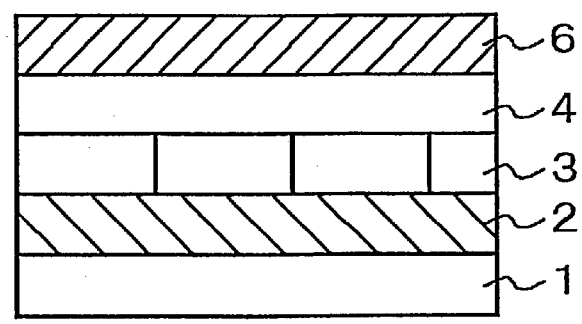

The organic EL device using said perylene compounds according to the present invention has a multi-layered structure having one or more than one organic thin-film layers formed between electrodes. Examples include the structure as shown in FIG. 1 wherein an anode 2, light-emitting layer 4 and cathode 6 have been stacked one after another on a substrate 1; the structure as shown in FIG. 2 wherein an anode 2, hole-transporting layer 3, light-emitting layer 4, electron-transporting layer 5 and cathode 6 have been stacked one after another on a substrate 1; and the structure as shown in FIG. 3 wherein an anode 2, hole-transporting layer 3, light-emitting layer 4 and cathode 6 have been stacked one after another on a substrate 1.

The compound of formula (1) in the present invention may be used in any one of the above-described organic layers such as hole-transporting layer 3, light-emitting layer 4 or electron-transporting layer 5. A mixture of the compound and another hole-transporting material, light-emitting material or electron-transporting material can be also used.

The pyrromethene-metal complex to be used for the organic EL device of the present invention is a compound having a structure represented by formula (3). In formula (3), M represents monovalent, divalent or trivalent metal ion; $R^1$ to $R^7$ each independently represents a hydrogen atom, a halogen atom, a hydroxy group, a substituted or unsubstituted amino group, a nitro group, a cyano group, a substituted or unsubstituted alkyl group, a substituted or unsubstituted alkenyl group, a substituted or unsubstituted styryl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group or a carboxyl group; and any two of $R^1$ to $R^7$ may form a ring.

Examples of the metal which may be used for M representing an monovalent, divalent or trivalent metal ion include, but not limited to, aluminum, beryllium, bismuth, cadmium, cerium, cobalt, copper, iron, gallium, germanium, mercury, indium, lanthanum, magnesium, molybdenum, niobium, antimony, scandium, tin, tantalum, thorium, titanium, uranium, tungsten, zirconium, vanadium, zinc, silver, gold, platinum, chromium, manganese, yttrium, nickel, palladium, lead, selenium, tellurium, thallium, calcium, strontium, barium, neodymium, europium and erbium.

Examples of $R^1$ to $R^7$ include a hydrogen atom, a halogen atom as mentioned before, a hydroxy group, a substituted or unsubstituted amino group group as mentioned before, a nitro group, a cyano group, a substituted or unsubstituted alkyl group group as mentioned before, a substituted or unsubstituted alkenyl group group as mentioned before, a substituted or unsubstituted styryl group as mentioned before, a substituted or unsubstituted cycloalkyl group group as mentioned before, a substituted or unsubstituted alkoxy group group as mentioned before, a substituted or unsubstituted aromatic hydrocarbon group group as mentioned before, a substituted or unsubstituted aromatic heterocyclic group group as mentioned before, a substituted or unsubstituted aralkyl group group as mentioned before, a substituted or unsubstituted aryloxy group group as mentioned before, a substituted or unsubstituted alkoxycarbonyl group group as mentioned before or a carboxyl group.

Examples of a bivalent group forming a ring include tetramethylene group, pentamethylene group, hexamethylene group, diphenylmethan-2,2'-diyl group, diphenylethan-3,3'-diyl group, diphenylpropan-4,4'-diyl group and 1,3-butadien-1,4-diyl group.

Examples of the compounds represented by formula (3) to be used in the organic EL device of the present invention are shown below, but it should be borne in mind that the present invention is not limited by them.

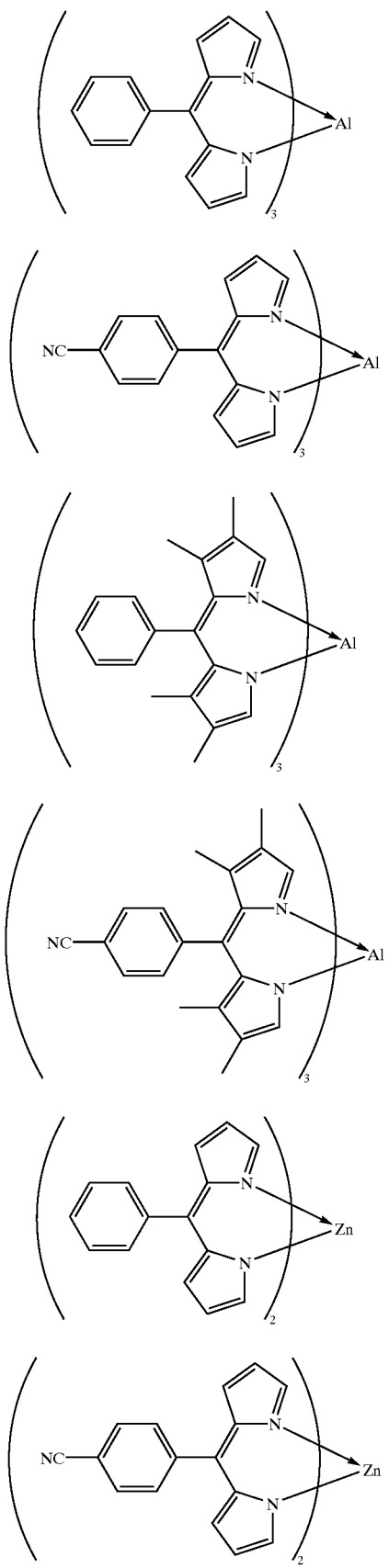
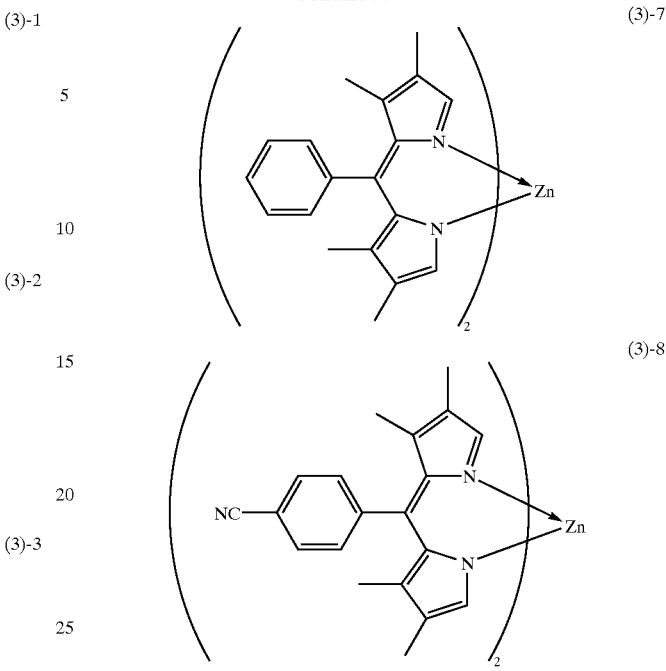

The organic EL device using said pyrromethene-metal complexes according to the present invention has a multi-layered structure having one or more than one organic thin-film layers formed between electrodes.

Figure 4:
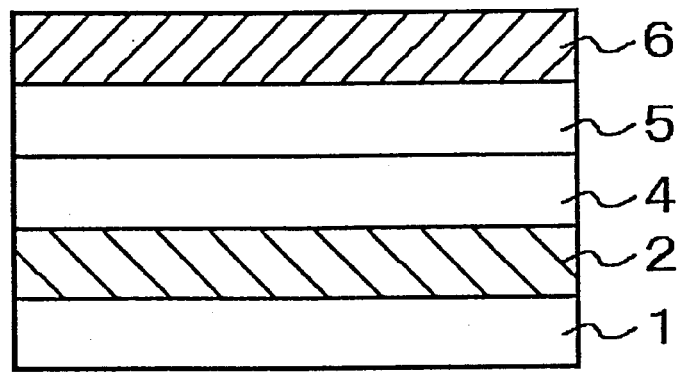

Examples include the structure as shown in FIG. 1 wherein an anode 2, light-emitting layer 4 and cathode 6 have been stacked one after another on a substrate 1; the structureas shown in FIG. 2 wherein an anode 2, hole-transporting layer 3, light-emitting layer 4, electron-transporting layer 5 and cathode 6 have been stacked one after another on a substrate 1; the structure as shown in FIG. 3 wherein an anode 2, hole-transporting layer 3, light-emitting layer 4 and cathode 6 have been stacked one after another on a substrate 1; and the structure as shown in FIG. 4 wherein an anode 2, light-emitting layer 4, electron-transporting layer 5 and cathode 6 have been stacked one after another on a substrate 1.

The compound of formula (3) in the present invention may be used in any one of the above-described organic layers such as hole-transporting layer 3, light-emitting layer 4 or electron-transporting layer 5. A mixture of the compound and another hole-transporting material, light-emitting material or electron-transporting material can be also used.

There is no particular limitation imposed on the hole-transporting material usable in the present invention. Any compound employed as an ordinary hole-transporting material may be used. Examples include bis-triarylamines such as bis[di(p-tolyl)aminophenyl]-1,1-cyclohexane represented by the below-described formula [01], N,N'-diphenyl-N,N'-bis(3-methylphenyl)-[1,1'-biphenyl]-4,4'-diamine represented by the below-described formula [02] and N,N'-diphenyl-N-N-bis(1-naphthyl)-[1,1'-biphenyl]-4,4'-diamine represented by the below-described formula [03] and compounds having starburst type structure represented by the below-described formulas [04] to [06]:

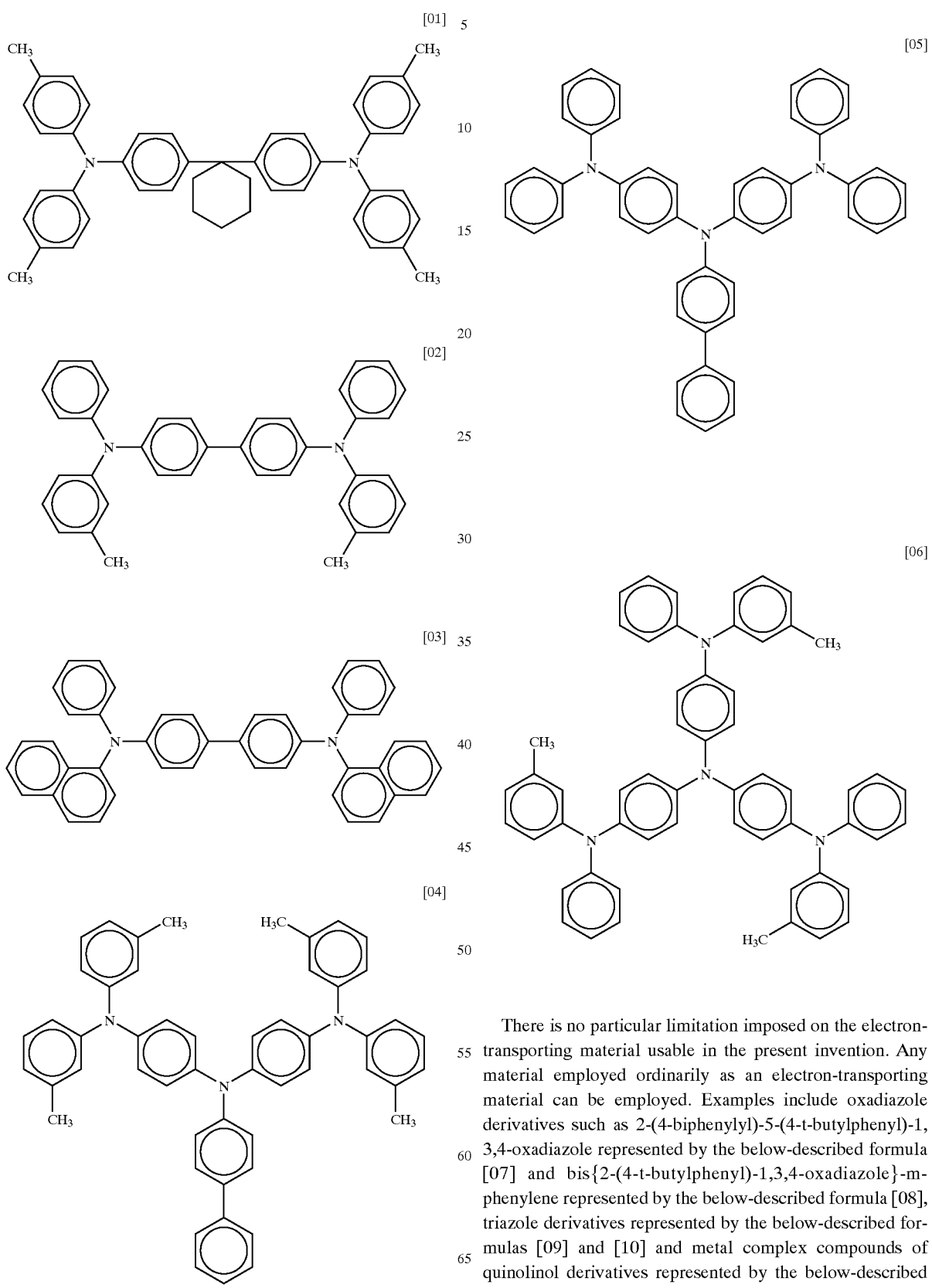

There is no particular limitation imposed on the electron-transporting material usable in the present invention. Any material employed ordinarily as an electron-transporting material can be employed. Examples include oxadiazole derivatives such as 2-(4-biphenylyl)-5-(4-t-butylphenyl)-1,3,4-oxadiazole represented by the below-described formula [07] and bis{2-(4-t-butylphenyl)-1,3,4-oxadiazole}-m-phenylene represented by the below-described formula [08], triazole derivatives represented by the below-described formulas [09] and [10] and metal complex compounds of quinolinol derivatives represented by the below-described formulas [11] to [14]:

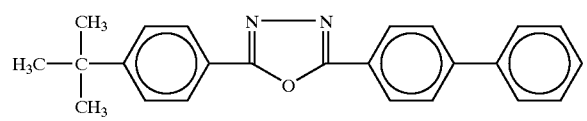
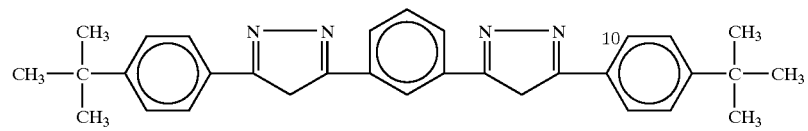
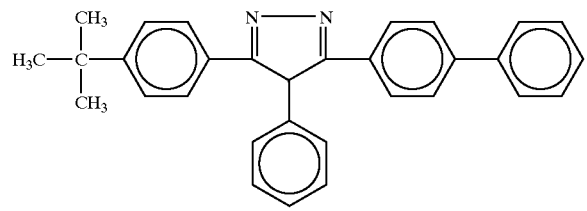
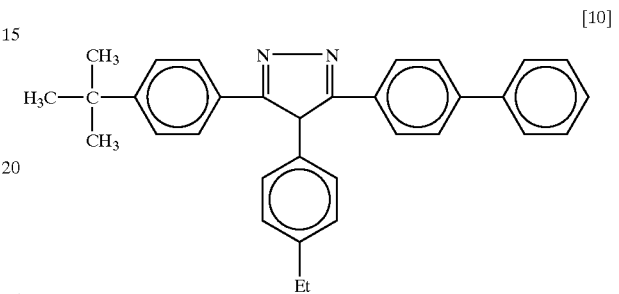
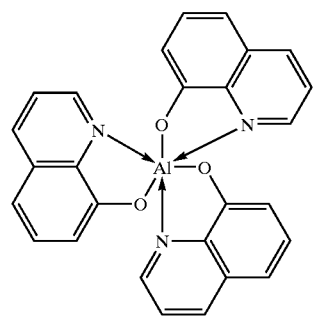
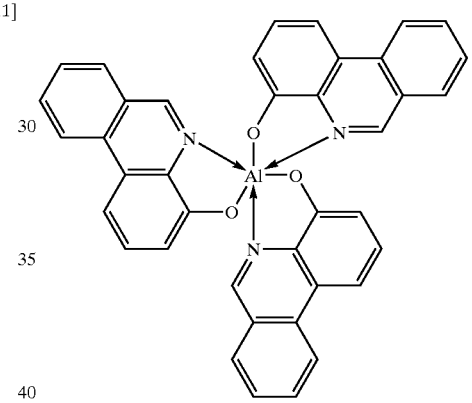
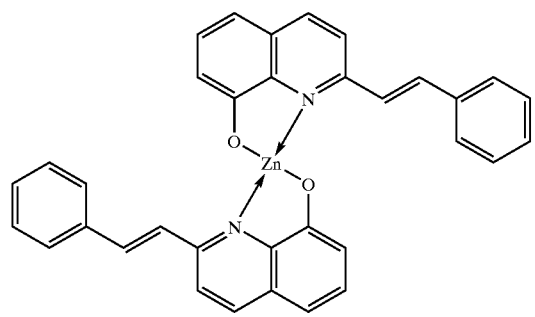
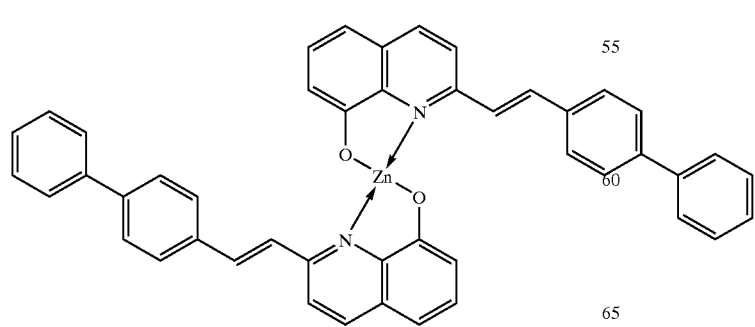

The anode of the organic EL device injects holes into the hole-transporting layer 3 or the light-emitting layer 4 and that having a work function of 4.5 eV or greater is effective. Specific examples of the anode material to be used for the organic EL device of the present invention include an indium tin oxide (ITO), tin oxide (NESA), gold, silver, platinum and copper.

For the injection of electrons into the electron-transporting layer 5 or light-emitting layer 4, the cathode of the organic EL device having a smaller work function is preferred. Although there is no particular limitation imposed on the cathode material, specific examples include indium, aluminum, magnesium, magnesium-indium alloy, magnesium-aluminum alloy, aluminum-lithium alloy, aluminum-scandium-lithium alloy and magnesium-silver alloy.

Each layer of the organic EL device according to the present invention can be fabricated by any known method such as, but not limited to, vacuum deposition and spin coating. The organic thin-film layer which is to be used in the organic EL device of the present invention and contains the compound of formula (1) or (3) can be fabricated by a known method such as vacuum deposition, molecular beam epitaxy (MBE) or coating of a solution such as dipping, spin coating, casting, bar coating or roll coating.

There is no particular limitations on the thickness of each organic layer of the organic EL device according to the present invention. When the thickness of layer is too thin, defects such as pin holes tend to occur. When the thickness of layer is too thick, on the other hand, a high-applied voltage is required, which decreases the efficiency. Usually, the organic layers are therefore preferred to have a thickness within a range of several nm to 1 $\mu$m.

The present invention will hereinafter be described in detail with reference to the following examples, but it should however be borne in mind that the present invention is not limited only to the following examples unless the spirit or scope of the invention is changed. In the following description, examples related to general formula (1) have a prefix "A" (e.g., A1, A2, . . . ) while those related to general formula (3) have a prefix "B" (e.g., B1, B2, . . . ).

EXAMPLES

Synthesis examples for a compound according to this invention will be first described.

Synthesis Example A1

Compound (1)-1
3-(N-(4-(4-methylphenylvinyl)phenyl)-N-p-tolylamino) perylene

The mixture of 3-bromoperylene, N-phenyl-p-toluidine, potassium carbonate, copper powder and nitrobenzene was stirred at 200° C. for 40 hours in a reaction vessel. After completion of the reaction, nitrobenzene was removed by vacuum distillation. Chloroform was added to the residue and the mixture was filtered to remove inorganic compounds. After concentrating the filtrate, the residue was purified according to conventional method, whereby 3-N-phenyl-N-p-tolylaminoperylene was obtained. It was then dissolved in toluene. Phosphorous oxychloride was added to the solution, and the mixture was stirred at room temperature. N-methylformanilide was added dropwise to the mixture, and the reaction mixture was stirred at 50° C. for 5 hours. Then, the reaction mixture was poured into cold water. The organic layer was separated, dried and concentrated. The residue was purified according to conventional method, whereby 3-(N-p-formylphenyl-N-p-tolylamino) perylene was obtained. It was reacted with diethyl p-methylbenzylphosphonate and sodium hydride in dimethylsulfoxide for one day. The reaction solution was poured into ice-water, and the mixture was extracted with chloroform. The organic layer was dried and concentrated. The residue was then purified according to conventional method, whereby the target Compound (1)-1 was obtained.

Synthesis Example A2

Compound (1)-2
3-(N-(4-(phenylvinyl)phenyl)-N-p-tolylamino)perylene

In a similar manner to Synthesis Example A1 except for the use of diethyl benzylphosphonate instead of diethyl p-methylbenzylphosphonate, the target Compound (1)-2 was obtained.

Synthesis Example A3

Compound (1)-3
3,10-bis(N-4-(4-methylphenylvinyl)phenyl-N-p-tolylamino)perylene

The mixture of 3,10-dibromoperylene, N-(4-(4-methylphenylvinyl) phenyl)-p-toluidine, potassium carbonate, copper powder and nitrobenzene was stirred at 200° C. for 40 hours in a reaction vessel. After completion of the reaction, nitrobenzene was removed by vacuum distillation. Chloroform was added to the residue and the mixture was filtered to remove inorganic compounds. After concentrating the filtrate, the residue was purified according to conventional method, whereby the target Compound (1)-3 was obtained.

Synthesis Example A4

Compound (1)-10
3-(N-4-(4-methylphenylvinyl)phenyl-N-p-tolylamino)-9-(N-p-tolyl-N-phenylamino)perylene In a similar manner to Synthesis Example A1 except for the use of 3,9-dibromoperylene instead of 3-bromoperylene, the target Compound (1)-10 was obtained.

Synthesis Example A5

Compound (1)-11
3,9-bis(N-4-(4-methylphenylvinyl)phenyl-N-p-tolylamino) perylene In a similar manner to Synthesis Example A3 except for the use of 3,9-dibromoperylene instead of 3,10-dibromoperylene, the target Compound (1)-11 was obtained.

Synthesis Example B1

5-Phenyl-4,6-dipilin

Trifluoroacetic acid was added to the solution of benzaldehyde and pyrrole in toluene and the reaction mixture was refluxed for 3 hours. The reaction mixture was washed with an aqueous solution of potassium carbonate and then dried. The mixture was purified according to conventional method, whereby 5-phenyldipyrromethane was obtained. It was then dissolved in chloroform. 2,3-dichloro-5,6-dicyano-1,4-quinone was added to the solution, and the reaction mixture was stirred at room temperature. The mixture was concentrated and purified by column chromatography, whereby the target compound, 5-phenyl-4,6-dipiline was obtained.

Synthesis Example B2

5-p-Cyanophenyl-4,6-dipilin

In a similar manner to Synthesis Example B1 except for the use of 4-cyanobenzaldehyde instead of benzaldehyde, the target compound, 5-p-cyanophenyl-4,6-dipilin was obtained.

Synthesis Example B3
2,3,7,8-Tetramethyl-5-phenyl-4,6-dipilin

In a similar manner to Synthesis Example B1 except for the use of 3,4-dimethylpyrrole instead of pyrrole, the target compound, 2,3,7,8-tetramethyl-5-phenyl-4,6-dipilin was obtained.

Synthesis Example B4
2,3,7,8-Tetramethyl-5-p-cyanophenyl-4,6-dipilin

In a similar manner to Synthesis Example B2 except for the use of 3,4-dimethylpyrrole instead of pyrrole, the target compound, 2,3,7,8-tetramethyl-5-p-cyanophenyl-4,6-dipilin was obtained.

Synthesis Example B5
Compound (3)-1
tri(5-phenyl-4,6-dipilin)-aluminum complex Aluminum chloride was added to the solution of 5-phenyl-4,6-dipilin in toluene and the mixture was refluxed for 8 hours. The reaction mixture was concentrated and purified by column chromatography on silica gel, whereby the target Compound (3)-1 was obtained.

Synthesis Example B6
Compound (3)-2
tri(5-p-cyanophenyl-4,6-dipilin)-aluminum complex In a similar manner to Synthesis Example B5 except for the use of 5-p-cyanophenyl-4,6-dipilin instead of 5-phenyl-4,6-dipilin, the target Compound (3)-2 was obtained.

Synthesis Example B7
Compound (3)-3
tri(2,3,7,8-tetramethyl-5-phenyl-4,6-dipilin)-aluminum complex In a similar manner to Synthesis Example B5 except for the use of 2,3,7,8-tetramethyl-5-phenyl-4,6-dipilin instead of 5-phenyl-4,6-dipilin, the target Compound (3)-3 was obtained.

Synthesis Example B8
Compound (3)-4
tri(2,3,7,8-tetramethyl-5-p-cyanophenyl-4,6-dipilin)-aluminum complex In a similar manner to Synthesis Example B5 except for the use of 2,3,7,8-tetramethyl-5-p-cyanophenyl-4,6-dipilin instead of 5-phenyl-4,6-dipilin, the target Compound (3)-4 was obtained.

Synthesis Example B9
Compound (3)-5
di(5-phenyl-4,6-dipilin)-zinc complex

Zinc acetate was added to a solution of 5-phenyl-4,6-dipilin in methanol and the mixture was refluxed for 4 hours. The reaction mixture was concentrated and purified by column chromatography on silica gel, whereby the target Compound (3)-5 was obtained.

Synthesis Example B10
Compound (3)-6
di(5-p-cyanophenyl-4,6-dipilin)-zinc complex In a similar manner to Synthesis Example B9 except for the use of 5-p-cyanophenyl-4,6-dipilin instead of 5-phenyl-4,6-dipilin, the target Compound (3)-6 was obtained.

Synthesis Example B11
Compound (3)-7
di(2,3,7,8-tetramethyl-5-phenyl-4,6-dipilin)-zinc complex In a similar manner to Synthesis Example B9 except for the use of 2,3,7,8-tetramethyl-5-phenyl-4,6-dipilin instead of 5-phenyl-4,6-dipilin, the target Compound (3)-7 was obtained.

Synthesis Example B12
Compound (3)-8
di(2,3,7,8-tetramethyl-5-p-cyanophenyl-4,6-dipilin)-zinc complex In a similar manner to Synthesis Example B9 except for the use of 2,3,7,8-tetramethyl-5-p-cyanophenyl-4,6-dipilin instead of 5-phenyl-4,6-dipilin, the target Compound (3)-8 was obtained.

A description will next be made of the following examples wherein the compound of formula (1) according to the present invention is used in a light-emitting layer (Examples A1 to A14 and A19 to A22); a mixture of the compound of formula (1) and a hole-transporting material is used in a light-emitting layer (Examples A15 to A18); a mixture of the compound of formula (1) and an electron-transporting material is used in a light-emitting layer (Examples A23 to A27); the compound of formula (1) is used in a hole-transporting layer (Examples A28 and A29); and the compound of formula (1) is used in an electron-transporting layer (Example A30).

Example A1

An organic EL device composed of three layers, that is, an anode, a light-emitting layer and a cathode as illustrated in the schematic cross-sectional view of FIG. 1 was fabricated. The device was prepared as follows. On a glass substrate, ITO was spattered as an anode 2 with a sheet resistance of 20 $\Omega/\square$. Over the anode 2, 40 nm thick light-emitting layer 4 was formed by vacuum deposition of Compound (1)-1. Then, a 200 nm thick cathode 6 was formed by vacuum deposition of magnesium-silver alloy, whereby the organic EL device was fabricated. When a dc voltage of 5V was applied to the device, light emission of 1020 cd/m$^2$ was obtained.

Example A2

In a similar manner to Example A1 except for the use of Compound (1)-2 instead of Compound (1)-1, an organic EL device was fabricated. When a dc voltage of 5V was applied to the resulting device, light emission of 980 cd/m$^2$ was obtained.

Example A3

In a similar manner to Example A1 except for the use of Compound (1)-3 instead of Compound (1)-1, an organic EL device was fabricated. When a dc voltage of 5V was applied to the resulting device, light emission of 1360 cd/m$^2$ was obtained.

Example A4

In a similar manner to Example A1 except for the use of Compound (1)-10 instead of Compound (1)-1, an organic EL device was fabricated. When a dc voltage of 5V was applied to the resulting device, light emission of 1210 cd/m$^2$ was obtained.

Example A5

In a similar manner to Example A1 except for the use of Compound (1)-11 instead of Compound (1)-1, an organic EL device was fabricated. When a dc voltage of 5V was applied to the resulting device, light emission of 1300 cd/m$^2$ was obtained.

Example A6

On a glass substrate, ITO was spattered as an anode 2 with a sheet resistance of 20 $\Omega/\square$. Over the anode, 40 nm thick light-emitting layer 4 was formed by spin coating of a chloroform solution of Compound (1)-11. Then, a 200 nm thick cathode 6 was formed by vacuum deposition of magnesium-silver alloy, whereby the organic EL device was fabricated. When a dc voltage of 5V was applied to the resulting device, light emission of 410 cd/m$^2$ was obtained.

Example A7

An organic EL device composed of 5 layers, that is, an anode, a hole-transporting layer, a light-emitting layer, an electron-transporting layer and a cathode as illustrated in the schematic cross-sectional view of FIG. 2 was fabricated. On a glass substrate, ITO was spattered as an anode 2 with a sheet resistance of 20 Ω/□. Over the anode 2, 50 nm thick hole-transporting layer 3 was formed by vacuum deposition of the compound of formula [02]. Then, a 40 nm thick light-emitting layer 4 was formed by the vacuum deposition of Compound (1)-1. A 20 nm thick electron-transporting layer 5 was formed by the vacuum deposition of the compound of formula [07]. Finally, a 200 nm thick cathode 6 was formed by the vacuum deposition of a magnesium-silver alloy, whereby the organic EL device of the present invention was fabricated. When a dc voltage of 10V was applied to the resulting device, light emission of 3400 cd/m$^2$ was obtained.

Example A8

In a similar manner to Example A7 except for the use of Compound (1)-2 instead of Compound (1)-1, an organic EL device was fabricated. When a dc voltage of 10V was applied to the resulting device, light emission of 3350 cd/m$^2$ was obtained.

Example A9

In a similar manner to Example A7 except for the use of Compound (1)-3 instead of Compound (1)-1, an organic EL device was fabricated. When a dc voltage of 10V was applied to the resulting device, light emission of 5300 cd/m$^2$ was obtained.

Example A10

In a similar manner to Example A7 except for the use of Compound (1)-10 instead of Compound (1)-1, an organic EL device was fabricated. When a dc voltage of 10V was applied to the resulting device, light emission of 4430 cd/m$^2$ was obtained.

Example A11

In a similar manner to Example A7 except for the use of Compound (1)-11 instead of Compound (1)-1, an organic EL device was fabricated. When a dc voltage of 10V was applied to the resulting device, light emission of 5740 cd/m$^2$ was obtained.

Example A12

In a similar manner to Example A11 except for the use of the compound of formula [03] instead of the compound of formula [02] in a hole-transporting layer and the compound of formula [08] instead of the compound of formula [07] in an electron-transporting layer, an organic EL device was fabricated. When a dc voltage of 10 V was applied to the resulting device, light emission of 6230 cd/m2 was obtained.

Example A13

In a similar manner to Example A7 except for the use of the compound of formula [04] instead of the compound of formula [02] in a hole-transporting layer, Compound (1)-3 instead of the Compound (1)-1 in a light-emitting layer and the compound of formula [11] instead of the compound of formula [07] in an electron-transporting layer, an organic EL device was fabricated. When a dc voltage of 10V was applied to the resulting device, light emission of 5580 cd/m2 was obtained.

Example A14

In a similar manner to Example A7 except for the use of the compound of formula [05] instead of the compound of formula [02] in a hole-transporting layer, Compound (1)-11 instead of the Compound (1)-1 in a light-emitting layer and the compound of formula [12] instead of the compound of formula [07] in an electron-transporting layer, an organic EL device was fabricated. When a dc voltage of 10V was applied to the resulting device, light emission of 5370 cd/m2 was obtained.

Example A15

In a similar manner to Example A7 except that a 50 nm thick light-emitting layer was formed by vacuum co-deposition of the compound of formula [03] and Compound (1)-1 at a weight ratio of 1:10, an organic EL device was fabricated. When a dc voltage of 10V was applied to the resulting device, blue light emission of 4250 cd/m$^2$ was obtained.

Example A16

In a similar manner to Example A15 except for the use of Compound (1)-2 instead of Compound (1)-1, an organic EL device was fabricated. When a dc voltage of 10V was applied to the resulting device, light emission of 4030 cd/m$^2$ was obtained.

Example A17

In a similar manner to Example A15 except for the use of Compound (1)-10 instead of Compound (1)-1, an organic EL device was fabricated. When a dc voltage of 10V was applied to the resulting device, light emission of 5370 cd/m$^2$ was obtained.

Example A18

In a similar manner to Example A15 except for the use of Compound (1)-11 instead of Compound (1)-1, an organic EL device was fabricated. When a dc voltage of 10V was applied to the resulting device, light emission of 6710 cd/m$^2$ was obtained.

Example A19

An organic EL device composed of 4 layers, that is, an anode, a hole-transporting layer, a light-emitting layer and a cathode as illustrated in the schematic cross-sectional view of FIG. 3 was fabricated. First, ITO was spattered on a glass substrate 1 to form a 120 nm thick film having a sheet resistance of 20 Ω/□ as anode 2. Over the anode, a 50 nm thick hole-transporting layer 3 was formed by the vacuum deposition of the compound of formula [03]. A 50 nm thick light-emitting layer 4 was then formed by the vacuum deposition of the Compound (1)-1. Then, a 200 nm thick cathode 6 was formed by the vacuum deposition of a magnesium-silver alloy, whereby the organic EL device of the present invention was fabricated. When a dc voltage of 10V was applied to the resulting device, light emission of 2370 cd/m$^2$ was obtained.

Example A20

In a similar manner to Example A19 except for the use of Compound (1)-3 instead of Compound (1)-1, an organic EL device was fabricated. When a dc voltage of 10V was applied to the resulting device, light emission of 3040 cd/m$^2$ was obtained.

Example A21

In a similar manner to Example A19 except for the use of Compound (1)-10 instead of Compound (1)-1, an organic EL device was fabricated. When a dc voltage of 10V was applied to the resulting device, light emission of 2880 cd/m$^2$ was obtained.

Example A22

In a similar manner to Example A19 except for the use of Compound (1)-11 instead of Compound (1)-1, an organic EL device was fabricated. When a dc voltage of 10V was applied to the resulting device, light emission of 3110 cd/m$^2$ was obtained.

Example A23

In a similar manner to Example A19 except that a 50 nm thick light-emitting layer was formed by vacuum co-deposition of the compound of formula [11] and Compound (1)-1 at a weight ratio of 20:1, an organic EL device was fabricated. When a dc voltage of 10V was applied to the resulting device, blue light emission of 1870 cd/m$^2$ was obtained.

Example A24

In a similar manner to Example A23 except for the use of Compound (1)-3 instead of Compound (1)-1, an organic EL device was fabricated. When a dc voltage of 10V was applied to the resulting device, light emission of 2230 cd/m$^2$ was obtained.

Example A25

In a similar manner to Example A23 except for the use of Compound (1)-10 instead of Compound (1)-1, an organic EL device was fabricated. When a dc voltage of 10V was applied to the resulting device, light emission of 2060 cd/m$^2$ was obtained.

Example A26

In a similar manner to Example A23 except for the use of Compound (1)-11 instead of Compound (1)-1, an organic EL device was fabricated. When a dc voltage of 10V was applied to the resulting device, light emission of 2030 cd/m$^2$ was obtained.

Example A27

In a similar manner to Example A19 except that a 50 nm thick hole-transporting layer was formed by vacuum deposition of the compound of formula [02] and a 50 nm thick light-emitting layer was formed by vacuum co-deposition of the compound of formula [13] and Compound (1)-11 at a weight ratio of 20:1, an organic EL device was fabricated. When a dc voltage of 10V was applied to the resulting device, blue light emission of 2160 cd/m$^2$ was obtained.

Example A28

In a similar manner to Example A7 except for the use of Compound (1)-1 instead of the compound of formula [02] and the use of the compound of formula [13] instead of Compound (1)-1, an organic EL device was fabricated. When a dc voltage of 10V was applied to the resulting device, light emission of 1760 cd/m$^2$ was obtained.

Example A29

In a similar manner to Example A28 except for the use of Compound (1)-11 instead of Compound (1)-1, an organic EL device was fabricated. When a dc voltage of 10V was applied to the resulting device, light emission of 1970 cd/m$^2$ was obtained.

Example A30

In a similar manner to Example A7 except for the use of Compound (1)-1 instead of the compound of formula [07] and the use of the compound of formula [11] instead of Compound (1)-1, an organic EL device was fabricated. When a dc voltage of 10V was applied to the resulting device, light emission of 760 cd/m$^2$ was obtained.

A description will next be made of the following examples wherein the compound of formula (3) according to the present invention is used in a light-emitting layer (Examples B1 to B25 and B31 to B34); a mixture of the compound of formula (3) and a hole-transporting material is used in a light-emitting layer (Examples B26 to B30); a mixture of the compound of formula (3) and an electron-transporting material is used in a light-emitting layer (Examples B35 to B39); the compound of formula (3) is used in a hole-transporting layer (Examples B40 and B41); and the compound of formula (3) is used in an electron-transporting layer (Example B42 and B43).

Example B1

An organic EL device composed of three layers, that is, an anode, a light-emitting layer and a cathode as illustrated in the schematic cross-sectional view of FIG. 1 was fabricated. The device was prepared as follows. On a glass substrate, ITO was spattered as an anode 2 with a sheet resistance of 20 Ω/□. Over the anode 2, 40 nm thick light-emitting layer 4 was formed by vacuum deposition of Compound (3)-1. Then, a 200 nm thick cathode 6 was formed by vacuum deposition of magnesium-silver alloy, whereby the organic EL device was fabricated. When a dc voltage of 5V was applied to the device, light emission of 400 cd/m$^2$ was obtained.

Example B2

In a similar manner to Example B1 except for the use of Compound (3)-2 instead of Compound (3)-1, an organic EL device was fabricated. When a dc voltage of 5V was applied to the resulting device, light emission of 370 cd/m$^2$ was obtained.

Example B3

In a similar manner to Example B1 except for the use of Compound (3)-3 instead of Compound (3)-1, an organic EL device was fabricated. When a dc voltage of 5V was applied to the resulting device, light emission of 650 cd/m$^2$ was obtained.

Example B4

In a similar manner to Example B1 except for the use of Compound (3)-4 instead of Compound (3)-1, an organic EL device was fabricated. When a dc voltage of 5V was applied to the resulting device, light emission of 540 cd/m$^2$ was obtained.

Example B5

In a similar manner to Example B1 except for the use of Compound (3)-5 instead of Compound (3)-1, an organic EL device was fabricated. When a dc voltage of 5V was applied to the resulting device, light emission of 350 cd/m$^2$ was obtained.

Example B6

In a similar manner to Example B1 except for the use of Compound (3)-6 instead of Compound (3)-1, an organic EL device was fabricated. When a dc voltage of 5V was applied to the resulting device, light emission of 300 cd/m$^2$ was obtained.

Example B7

In a similar manner to Example B1 except for the use of Compound (3)-7 instead of Compound (3)-1, an organic EL device was fabricated. When a dc voltage of 5V was applied to the resulting device, light emission of 380 cd/m$^2$ was obtained.

Example B8

In a similar manner to Example B1 except for the use of Compound (3)-8 instead of Compound (3)-1, an organic EL device was fabricated. When a dc voltage of 5V was applied to the resulting device, light emission of 310 cd/m$^2$ was obtained.

Example B9

An organic EL device composed of three layers, that is, an anode, a light-emitting layer and a cathode as illustrated in the schematic cross-sectional view of FIG. 1 was fabricated. On a glass substrate, ITO was spattered as an anode 2 with a sheet resistance of 20 Ω/□. Over the anode, 40 nm thick light-emitting layer 4 was formed by spin coating of a chloroform solution of Compound (3)-5. Then, a 200 nm thick cathode 6 was formed by vacuum deposition of magnesium-silver alloy, whereby the organic EL device was fabricated. When a dc voltage of 5V was applied to the resulting device, light emission of 120 cd/m$^2$ was obtained.

Example B10

In a similar manner to Example B9 except for the use of Compound (3)-7 instead of Compound (3)-5, an organic EL device was fabricated. When a dc voltage of 5V was applied to the resulting device, light emission of 130 cd/m$^2$ was obtained.

Example B11

An organic EL device composed of 5 layers, that is, an anode, a hole-transporting layer, a light-emitting layer, an electron-transporting layer and a cathode as illustrated in the schematic cross-sectional view of FIG. 2 was fabricated. On a glass substrate, ITO was spattered as an anode 2 with a sheet resistance of 20 Ω/□. Over the anode 2, 50 nm thick hole-transporting layer 3 was formed by vacuum deposition of the compound of formula [02]. Then, a 40 nm thick light-emitting layer 4 was formed by the vacuum deposition of Compound (3)-1. A 20 nm thick electron-transporting layer 5 was formed by the vacuum deposition of the compound of formula [07]. Finally, a 200 nm thick cathode 6 was formed by the vacuum deposition of a magnesium-silver alloy, whereby the organic EL device of the present invention was fabricated. When a dc voltage of 10V was applied to the resulting device, light emission of 2370 cd/m$^2$ was obtained.

Example B12

In a similar manner to Example B11 except for the use of Compound (3)-2 instead of Compound (3)-1, an organic EL device was fabricated. When a dc voltage of 10V was applied to the resulting device, light emission of 1860 cd/m$^2$ was obtained.

Example B13

In a similar manner to Example B11 except for the use of Compound (3)-3 instead of Compound (3)-1, an organic EL device was fabricated. When a dc voltage of 10V was applied to the resulting device, light emission of 2510 cd/m$^2$ was obtained.

Example B14

In a similar manner to Example B11 except for the use of Compound (3)-4 instead of Compound (3)-1, an organic EL device was fabricated. When a dc voltage of 10V was applied to the resulting device, light emission of 1970 cd/m$^2$ was obtained.

Example B15

In a similar manner to Example B11 except for the use of Compound (3)-5 instead of Compound (3)-1, an organic EL device was fabricated. When a dc voltage of 10V was applied to the resulting device, light emission of 1260 cd/m$^2$ was obtained.

Example B16

In a similar manner to Example B11 except for the use of Compound (3)-6 instead of Compound (3)-1, an organic EL device was fabricated. When a dc voltage of 10V was applied to the resulting device, light emission of 1070 cd/m$^2$ was obtained.

Example B17

In a similar manner to Example B11 except for the use of Compound (3)-7 instead of Compound (3)-1, an organic EL device was fabricated. When a dc voltage of 10V was applied to the resulting device, light emission of 1380 cd/m$^2$ was obtained.

Example B18

In a similar manner to Example B11 except for the use of Compound (3)-8 instead of Compound (3)-1, an organic EL device was fabricated. When a dc voltage of 10V was applied to the resulting device, light emission of 1110 cd/m$^2$ was obtained.

Example B19

In a similar manner to Example B11 except for the use of the compound of formula [03] instead of the compound of formula [02] and the use of the compound of formula [08] instead of the compound of formula [07], an organic EL device was fabricated. When a dc voltage of 10V was applied to the resulting device, light emission of 2240 cd/m$^2$ was obtained.

Example B20

In a similar manner to Example B11 except for the use of the compound of formula [04] instead of the compound of formula [02], the use of Compound (3)-2 instead of Compound (3)-1 and the use of the compound of formula [11]

instead of the compound of formula [07], an organic EL device was fabricated. When a dc voltage of 10V was applied to the resulting device, light emission of 1680 cd/m$^2$ was obtained.

Example B21

In a similar manner to Example B11 except for the use of the compound of formula [05] instead of the compound of formula [02], the use of Compound (3)-3 instead of Compound (3)-1 and the use of the compound of formula [12] instead of the compound of formula [07], an organic EL device was fabricated. When a dc voltage of 10V was applied to the resulting device, light emission of 2520 cd/m$^2$ was obtained.

Example B22

An organic EL device composed of 4 layers, that is, an anode, a light-emitting layer, an electron-transporting layer and a cathode as illustrated in the schematic cross-sectional view of FIG. 4 was fabricated. On a glass substrate, ITO was spattered as an anode 2 with a sheet resistance of 20 Ω/□. Over the anode 2, a 40 nm thick light-emitting layer 4 was formed by the vacuum deposition of Compound (3)-1. Then, a 50 nm thick electron-transporting layer 5 was formed by the vacuum deposition of the compound of formula [09]. Finally, a 200 nm thick cathode 6 was formed by the vacuum deposition of a magnesium-silver alloy, whereby the organic EL device of the present invention was fabricated. When a dc voltage of 10V was applied to the resulting device, light emission of 1090 cd/m$^2$ was obtained.

Example B23

In a similar manner to Example B22 except for the use of Compound (3)-2 instead of Compound (3)-1, an organic EL device was fabricated. When a dc voltage of 10V was applied to the resulting device, light emission of 960 cd/m$^2$ was obtained.

Example B24

In a similar manner to Example B22 except for the use of Compound (3)-3 instead of Compound (3)-1, an organic EL device was fabricated. When a dc voltage of 10V was applied to the resulting device, light emission of 1220 cd/m$^2$ was obtained.

Example B25

In a similar manner to Example B22 except for the use of Compound (3)-4 instead of Compound (3)-1, an organic EL device was fabricated. When a dc voltage of 10V was applied to the resulting device, light emission of 1020 cd/m$^2$ was obtained.

Example B26

In a similar manner to Example B22 except that a 50 nm thick light-emitting layer was formed by vacuum co-deposition of the compound of formula [03] and Compound (3)-1 at a weight ratio of 1:10, an organic EL device was fabricated. When a dc voltage of 10V was applied to the resulting device, blue light emission of 1290 cd/m$^2$ was obtained.

Example B27

In a similar manner to Example B26 except for the use of Compound (3)-2 instead of Compound (3)-1, an organic EL device was fabricated. When a dc voltage of 10V was applied to the resulting device, light emission of 1060 cd/m$^2$ was obtained.

Example B28

In a similar manner to Example B26 except for the use of Compound (3)-3 instead of Compound (3)-1, an organic EL device was fabricated. When a dc voltage of 10V was applied to the resulting device, light emission of 1450 cd/m$^2$ was obtained.

Example B29

In a similar manner to Example B26 except for the use of Compound (3)-4 instead of Compound (3)-1, an organic EL device was fabricated. When a dc voltage of 10V was applied to the resulting device, light emission of 1170 cd/m$^2$ was obtained.

Example B30

An organic EL device composed of 4 layers, that is, an anode, a light-emitting layer, an electron-transporting layer and a cathode as illustrated in the schematic cross-sectional view of FIG. 4 was fabricated. On a glass substrate, ITO was spattered as an anode 2 with a sheet resistance of 20 Ω/□. Over the anode 2, a 40 nm thick light-emitting layer 4 was formed by spin coating of a chloroform solution of a 1:10 (molar ratio) mixture of Compound (3)-4 and the compound of formula [03]. Then, a 50 nm thick electron-transporting layer 5 was formed by the vacuum deposition of the compound of formula [01]. Finally, a 200 nm thick cathode 6 was formed by the vacuum deposition of a magnesium-silver alloy, whereby the organic EL device of the present invention was fabricated. When a dc voltage of 10V was applied to the resulting device, light emission of 730 cd/m$^2$ was obtained.

Example B31

An organic EL device composed of 4 layers, that is, an anode, a hole-transporting layer, a light-emitting layer and a cathode as illustrated in the schematic cross-sectional view of FIG. 3 was fabricated. First, ITO was sputtered on a glass substrate 1 to form a 120 nm thick film having a sheet resistance of 20 Ω/□ as anode 2. Over the anode 2, 50 nm thick hole-transporting layer 3 was formed by vacuum deposition of the compound of formula [03]. Then, a 40 nm thick light-emitting layer 4 was formed by the vacuum deposition of Compound (3)-1. Finally, a 200 nm thick cathode 6 was formed by the vacuum deposition of a magnesium-silver alloy, whereby the organic EL device of the present invention was fabricated. When a dc voltage of 10V was applied to the resulting device, light emission of 1820 cd/m$^2$ was obtained.

Example B32

In a similar manner to Example B31 except for the use of Compound (3)-2 instead of Compound (3)-1, an organic EL device was fabricated. When a dc voltage of 10V was applied to the resulting device, light emission of 1560 cd/m$^2$ was obtained.

Example B33

In a similar manner to Example B31 except for the use of Compound (3)-3 instead of Compound (3)-1, an organic EL device was fabricated. When a dc voltage of 10V was applied to the resulting device, light emission of 2020 cd/m$^2$ was obtained.

Example B34

In a similar manner to Example B31 except for the use of Compound (3)-4 instead of Compound (3)-1, an organic EL device was fabricated. When a dc voltage of 10V was applied to the resulting device, light emission of 1760 cd/m² was obtained.

Example B35

In a similar manner to Example B31 except that a 50 nm thick light-emitting layer was formed by vacuum co-deposition of the compound of formula [11] and Compound (3)-1 at a weight ratio of 20:1, an organic EL device was fabricated. When a dc voltage of 10V was applied to the resulting device, blue light emission of 2190 cd/m² was obtained.

Example B36

In a similar manner to Example B31 except that a 50 nm thick light-emitting layer was formed by vacuum co-deposition of the compound of formula [11] and Compound (3)-2 at a weight ratio of 20:1, an organic EL device was fabricated. When a dc voltage of 10V was applied to the resulting device, blue light emission of 1960 cd/m² was obtained.

Example B37

In a similar manner to Example B31 except that a 50 nm thick light-emitting layer was formed by vacuum co-deposition of the compound of formula [11] and Compound (3)-3 at a weight ratio of 20:1, an organic EL device was fabricated. When a dc voltage of 10V was applied to the resulting device, blue light emission of 2320 cd/m² was obtained.

Example B38

In a similar manner to Example B31 except that a 50 nm thick light-emitting layer was formed by vacuum co-deposition of the compound of formula [11] and Compound (3)-4 at a weight ratio of 20:1, an organic EL device was fabricated. When a dc voltage of 10V was applied to the resulting device, blue light emission of 2030 cd/m² was obtained.

Example B39

In a similar manner to Example B31 except that a 50 nm thick hole-transporting layer was formed by vacuum deposition of the compound of formula [02] and a 50 nm thick light-emitting layer was formed by vacuum co-deposition of the compound of formula [13] and Compound (3)-4 at a weight ratio of 20:1, an organic EL device was fabricated. When a dc voltage of 10V was applied to the resulting device, blue light emission of 2080 cd/m² was obtained.

Example B40

In a similar manner to Example B11 except for the use of Compound (3)-1 instead of the compound of formula [02] and the use of the compound of formula [13] instead of Compound (3)-1, an organic EL device was fabricated. When a dc voltage of 10V was applied to the resulting device, light emission of 240 cd/m² was obtained.

Example B41

In a similar manner to Example B40 except for the use of Compound (3)-3 instead of Compound (3)-1 in a hole-transporting layer, an organic EL device was fabricated. When a dc voltage of 10V was applied to the resulting device, light emission of 270 cd/m² was obtained.

Example B42

In a similar manner to Example B11 except for the use of the compound of formula [11] instead of the Compound (3)-1 and the Compound (3)-1 instead of the compound of formula [07], an organic EL device was fabricated. When a dc voltage of 10V was applied to the resulting device, light emission of 760 cd/m² was obtained.

Example B43

In a similar manner to Example B42 except for the use of Compound (3)-2 instead of Compound (3)-1 in an electron-transporting layer, an organic EL device was fabricated. When a dc voltage of 10V was applied to the resulting device, light emission of 890 cd/m² was obtained.

What is claimed is:

1. An organic electroluminescent device comprising an anode, a cathode and one or more than one organic thin-film layers including a light-emitting layer between said anode and said cathode, wherein at least one of said organic thin-film layers contains, either singly or as a mixture, a perylene compound represented by the following formula (1):

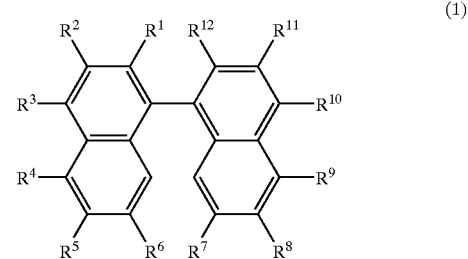

wherein $R^1$ to $R^{12}$ each independently represents a hydrogen atom, a halogen atom, a hydroxy group, a styryl-substituted diarylamino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group or a substituted or unsubstituted aryloxy group, although at least one of $R^1$ to $R^{12}$ is a styryl-substituted diarylamino group; wherein said styryl-substituted diarylamino group is represented by the following formula (2) in which only one of the aryl groups is substituted with a styryl group such that said styryl-substituted diarylamino group has styryl asymmetry:

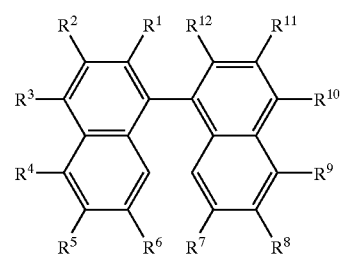

(1)

wherein $R^1$ to $R^{12}$ each independently represents a hydrogen atom, a halogen atom, a hydroxy group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group or a substituted or unsubstituted aryloxy group; although at least one of $R^1$ to $R^{12}$ is a substituted amino group represented by the following formula (2):

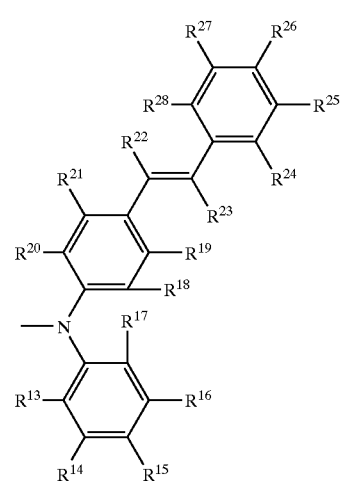

(2)

wherein $R^{13}$ to $R^{23}$ each independently represents a hydrogen atom, a halogen atom, a hydroxy group, a substituted or unsubstituted amino group (except diarylamino group), a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, a substituted or unsubstituted styryl group except $R^{13}$ to $R^{17}$, or a carboxyl group; and any two of $R^{13}$ to $R^{23}$ may form a ring; and $R^{24}$ to $R^{28}$ each independently represents a hydrogen atom, a halogen atom, a hydroxy group, a substituted or unsubstituted diarylamino group expressed by —$NAr_1{}^1Ar_1{}^2$ wherein $Ar_1{}^1$ and $Ar_1{}^2$ each independently represents substi-

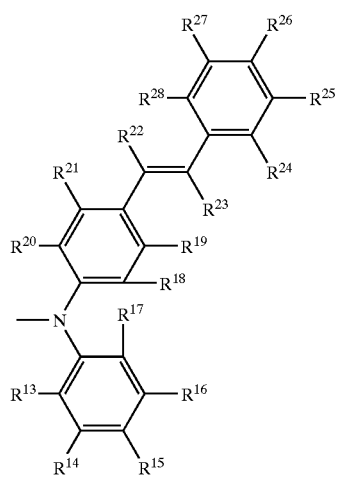

(2)

wherein $R^{13}$ to $R^{23}$ each independently represents a hydrogen atom, a halogen atom, a hydroxy group, a substituted or unsubstituted amino group (except diarylamino group), a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, a substituted or unsubstituted styryl group except $R^{13}$ to $R^{17}$, or a carboxyl group; and any two of $R^{13}$ to $R^{23}$ may form a ring; and $R^{24}$ to $R^{28}$ each independently represents a hydrogen atom, a halogen atom, a hydroxy group, a substituted or unsubstituted diarylamino group expressed by —$NAr_1{}^1Ar_1{}^2$ wherein $Ar_1{}^1$ and $Ar_1{}^2$ each independently represents substituted or unsubstituted aryl group having 6–20 carbon atoms, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group or a carboxyl group; and any two of $R^{24}$ to $R^{28}$ may form a ring.

2. An organic electroluminescent device as defined in claim 1, wherein the organic thin-film layer includes at least a light-emitting layer which contains, either singly or as a mixture, a compound of formula (1), and a hole-transporting layer.

3. An organic electroluminescent device comprising an anode, a cathode and two or more organic thin-film layers including a light-emitting layer and a hole-transporting layer between said anode and said cathode, wherein at least the hole-transporting layer contains, either singly or as a mixture, a perylene compound represented by the following formula (1):

tuted or unsubstituted aryl group having 6–20 carbon atoms, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group or a carboxyl group; and any two of $R^{24}$ to $R^{28}$ may form a ring.

4. An organic electroluminescent device comprising an anode, a cathode and three or more organic thin-film layers including a light-emitting layer, an electron-transporting layer and a hole-transporting layer between said anode and said cathode, wherein at least the electron transporting layer contains, either singly or as a mixture, a perylene compound represented by the following formula (1):

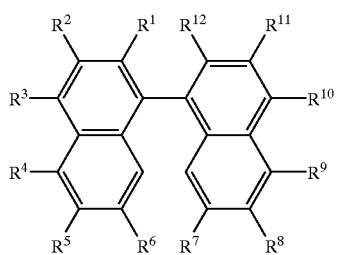

(1)

wherein $R^1$ to $R^{12}$ each independently represents a hydrogen atom, a halogen atom, a hydroxy group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group or a substituted or unsubstituted aryloxy group; although at least one of $R^1$ to $R^{12}$ is a substituted amino group represented by the following formula (2):

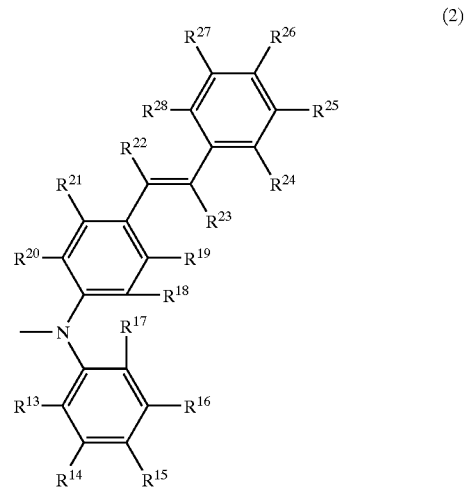

(2)

wherein $R^{13}$ to $R^{23}$ each independently represents a hydrogen atom, a halogen atom, a hydroxy group, a substituted or unsubstituted amino group (except diarylamino group), a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, a substituted or unsubstituted styryl group except $R^{13}$ to $R^{17}$, or a carboxyl group; and any two of $R^{13}$ to $R^{23}$ may form a ring; and $R^{24}$ to $R^{28}$ each independently represents a hydrogen atom, a halogen atom, a hydroxy group, a substituted or unsubstituted diarylamino group expressed by —$NAr_1^1 Ar_1^2$ wherein $Ar_1^1$ and $Ar_1^2$ each independently represents substituted or unsubstituted aryl group having 6–20 carbon atoms, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group or a carboxyl group; and any two of $R^{24}$ to $R^{28}$ may form a ring.

* * * * *